(12) United States Patent
Jung et al.

(10) Patent No.: US 10,839,929 B2
(45) Date of Patent: Nov. 17, 2020

(54) MEMORY DEVICE

(71) Applicant: SAMSUNG ELECTRONICS CO., LTD., Suwon-si (KR)

(72) Inventors: Moon Ki Jung, Seoul (KR); Boh Chang Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/445,722

(22) Filed: Jun. 19, 2019

(65) Prior Publication Data
US 2020/0160927 A1    May 21, 2020

(30) Foreign Application Priority Data
Nov. 19, 2018 (KR) .................. 10-2018-0142425

(51) Int. Cl.
| | |
|---|---|
| G11C 17/16 | (2006.01) |
| H01L 23/525 | (2006.01) |
| G11C 17/18 | (2006.01) |
| G11C 29/50 | (2006.01) |
| H01L 27/112 | (2006.01) |
| G11C 29/24 | (2006.01) |
| H01F 10/32 | (2006.01) |
| G11C 11/16 | (2006.01) |
| G11C 13/00 | (2006.01) |
| H01L 27/24 | (2006.01) |
| H01L 45/00 | (2006.01) |
| H01L 43/02 | (2006.01) |

(52) U.S. Cl.
CPC .............. *G11C 17/16* (2013.01); *G11C 17/18* (2013.01); *G11C 29/24* (2013.01); *G11C 29/50* (2013.01); *H01L 23/5252* (2013.01); *H01L 27/11206* (2013.01); *G11C 11/161* (2013.01); *G11C 11/1675* (2013.01); *G11C 13/0004* (2013.01); *G11C 13/0069* (2013.01); *G11C 13/0097* (2013.01); *G11C 2013/0078* (2013.01); *H01F 10/329* (2013.01); *H01L 27/2427* (2013.01); *H01L 43/02* (2013.01); *H01L 45/06* (2013.01); *H01L 45/126* (2013.01); *H01L 45/1233* (2013.01); *H01L 45/144* (2013.01)

(58) Field of Classification Search
CPC ......... G11C 17/16; G11C 29/24; G11C 29/50; G11C 17/18
See application file for complete search history.

(56) References Cited

U.S. PATENT DOCUMENTS

| | | | |
|---|---|---|---|
| 2006/0197178 A1* | 9/2006 | Chung | G11C 17/16 257/528 |
| 2008/0157269 A1 | 7/2008 | Wong et al. | |
| 2018/0204843 A1* | 7/2018 | Son | G11C 17/16 |

\* cited by examiner

*Primary Examiner* — Jay W. Radke
(74) *Attorney, Agent, or Firm* — Lee IP Law, PC

(57) ABSTRACT

A memory device includes a memory cell array including a plurality of memory cells and a memory controller to control the plurality of memory cells. The memory cell array has a first fuse region including a plurality of first fuse cells having a same structure as the plurality of memory cells and a second fuse region including a plurality of second fuse cells having a structure different from a structure of the plurality of memory cells. The memory controller has a fuse selection circuit selecting one of the first fuse region and the second fuse region.

15 Claims, 17 Drawing Sheets

MEMORY DEVICE

CROSS-REFERENCE TO RELATED APPLICATION

Korean Patent Application No. 10-2018-0142425, filed on Nov. 19, 2018, in the Korean Intellectual Property Office, and entitled: "Memory Device," is incorporated by reference herein in its entirety.

BACKGROUND

1. Field

Embodiments relate to a memory device.

2. Description of the Related Art

A memory device includes fuse cells, and the fuse cells may be used for the purpose of implementing various functions. For example, in order to increase the yield of a memory device or improve the reliability thereof, a fuse cell may be used as a redundancy memory cell for replacing a defective memory cell. Alternatively, fuse cells may also be used for writing data related to the manufacturing history of a memory device, a test procedure after fab-out when fabrication is finished, and/or a customizing procedure for optimizing characteristics of a memory device. Research on fuse cells which can be used for various functions is being actively pursued.

SUMMARY

According to an embodiment, a memory device includes a memory cell array including a plurality of memory cells and a memory controller to control the plurality of memory cells. The memory cell array has a first fuse region including a plurality of first fuse cells having a same structure as the structure of the memory cells in the plurality of memory cells, and has a second fuse region including a plurality of second fuse cells having a structure different from a structure of the memory cells in the plurality of memory cells. The memory controller has a fuse selection circuit selecting one of the first fuse region and the second fuse region.

According to an embodiment, a memory device may include a memory cell array including a plurality of memory cells that store data using changes in resistance, a plurality of electrical fuse cells having a structure the same as a structure of the plurality of memory cells, and a plurality of antifuse cells; and a fuse selection circuit to select one among the plurality of electrical fuse cells and the plurality of antifuse cells.

According to an embodiment, a memory device may include: a plurality of memory cells to store data using changes in resistance; a plurality of first fuse cells, having a structure the same as a structure of the plurality of memory cells; and a plurality of second fuse cells, having a structure different from a structure of the plurality of memory cells.

BRIEF DESCRIPTION OF DRAWINGS

Features will become apparent to those of skill in the art by describing in detail exemplary embodiments with reference to the attached drawings in which.

DETAILED DESCRIPTION

Figure 1:
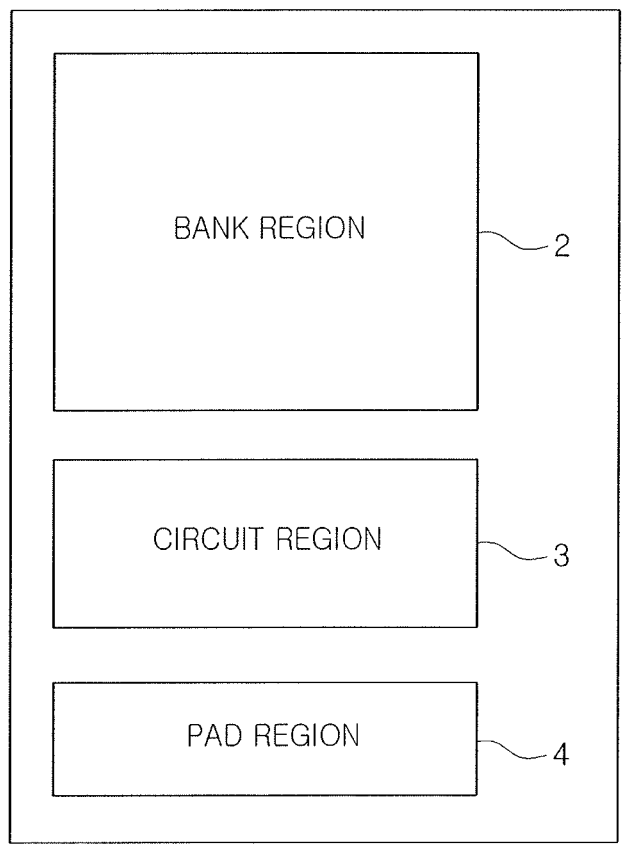
FIGS. 1 and 2 illustrate a memory device according to an example embodiment.
Figure 2:
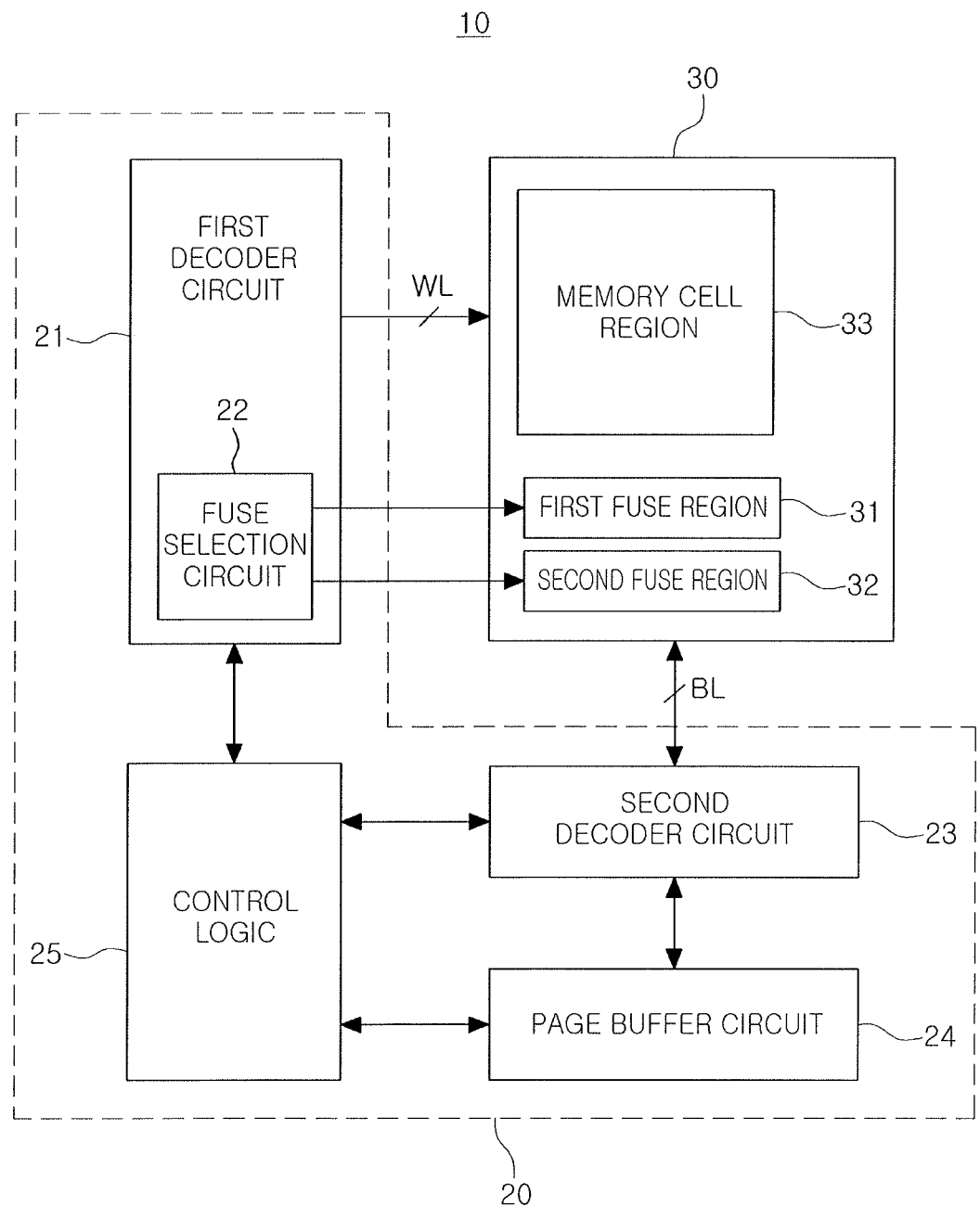

FIGS. 1 and 2 illustrates a memory device according to an example embodiment.

First, referring to FIG. 1, a memory device 1 according to an example embodiment may include a bank region 2, a circuit region 3, a pad region 4, and the like. A memory cell array having a plurality of memory cells may be arranged in bank units in the bank region 2. For example, the bank region 2 may include a plurality of memory cell arrays.

The circuit region 3 may be a region in which various circuits for operation of the memory device 1 are formed. For example, the circuits, included in the circuit region 3, may select at least a portion among memory cells, included in the bank region 2, and may write data to the selected memory cells or may read data from the selected memory cells. The pad region 4 may be a region in which a plurality of pads for inputting and outputting a control signal and data are formed.

Next, referring to FIG. 2, a memory device 10 according to an example embodiment may include a memory controller 20 and a memory cell array 30. The memory controller 20 may include a first decoder circuit 21, a second decoder circuit 23, a page buffer circuit 24, a control logic 25, and the like. The first decoder circuit 21 may be connected to the memory cell array 30 through a word line WL, while the second decoder circuit 23 may be connected to the memory cell array 30 through a bit line BL.

The page buffer circuit 24 may write data to at least one memory cell, selected by the first decoder circuit 21 and the second decoder circuit 23, or may read data from the memory cell. The control logic 25 may control operations of the first decoder circuit 21, the second decoder circuit 23, and the page buffer circuit 24.

The memory cell array 30 may include a memory cell region 33 having a plurality of memory cells, a first fuse region 31 having first fuse cells, and a second fuse region 32 having second fuse cells. The first fuse cells may have a structure the same as a structure of the memory cells, while the second fuse cells may have a structure different from a structure of the memory cells. For example, the first fuse cells may be electrical fuse (E-Fuse) cells, while the second fuse cells may be antifuse cells.

When the memory cells store data using changes in resistance, data stored in the first fuse cells may be unintentionally deleted in at least one of a test procedure, an assembly process after fab-out when fabrication is finished, and a process in which the user uses the memory device 10. The data stored in the first fuse cells may be used for customizing and/or a test procedure of the memory device 10. Thus, when the data stored in the first fuse cells is unintentionally deleted, a test procedure may not be correctly performed and/or the customizing may not be correctly performed. Thus, reliability and/or performance of the memory device 10 may be degraded.

In an example embodiment, the data, stored in the first fuse cells, may be transferred and written to the second fuse cells after the test procedure and/or an assembly process is terminated. As described above, the second fuse cells have a structure different from a structure of the memory cells, e.g., may be implemented as antifuse cells. As such, data stored in the second fuse cells may be not deleted during a test procedure and an assembly process, or while the user uses the memory device 10. Thus, reliability and a performance of the memory device 10 can be improved.

For example, the fuse selection circuit 22 included in the first decoder circuit 21 may select one of the first fuse region 31 and the second fuse region 32. For example, when the fuse selection circuit 22 selects the first fuse region 31, the first decoder circuit 21 may access the first fuse region 31 rather than the second fuse region 32, and the page buffer circuit 24 may write data to the first fuse cells or may read data from the first fuse cells. Alternatively, when the fuse selection circuit 22 selects the second fuse region 32, the first decoder circuit 21 may access the second fuse region 32 rather than the first fuse region 31, and the page buffer circuit 24 may write data to the second fuse cells or may read data from the second fuse cells. In an example embodiment, the fuse selection circuit 22 may include a switching circuit.

Figure 3:
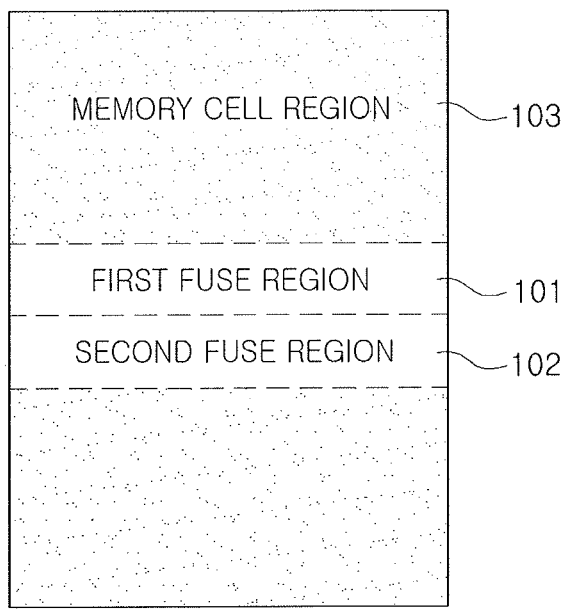
FIGS. 3 to 5 illustrate a memory cell array included in a memory device according to an example embodiment.
Figure 4:
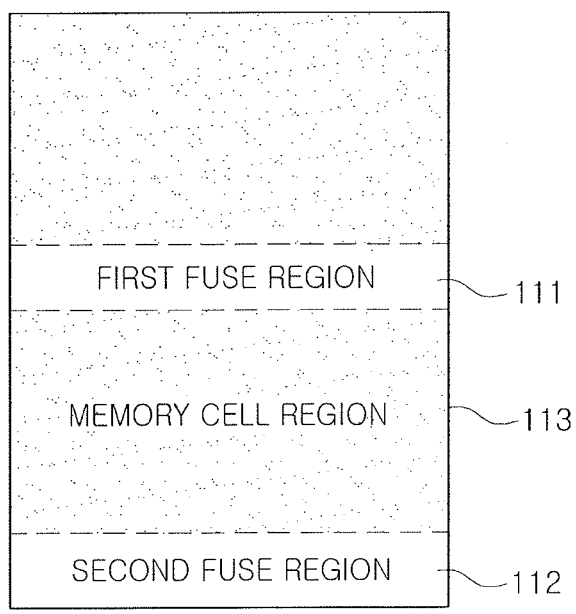
Figure 5:
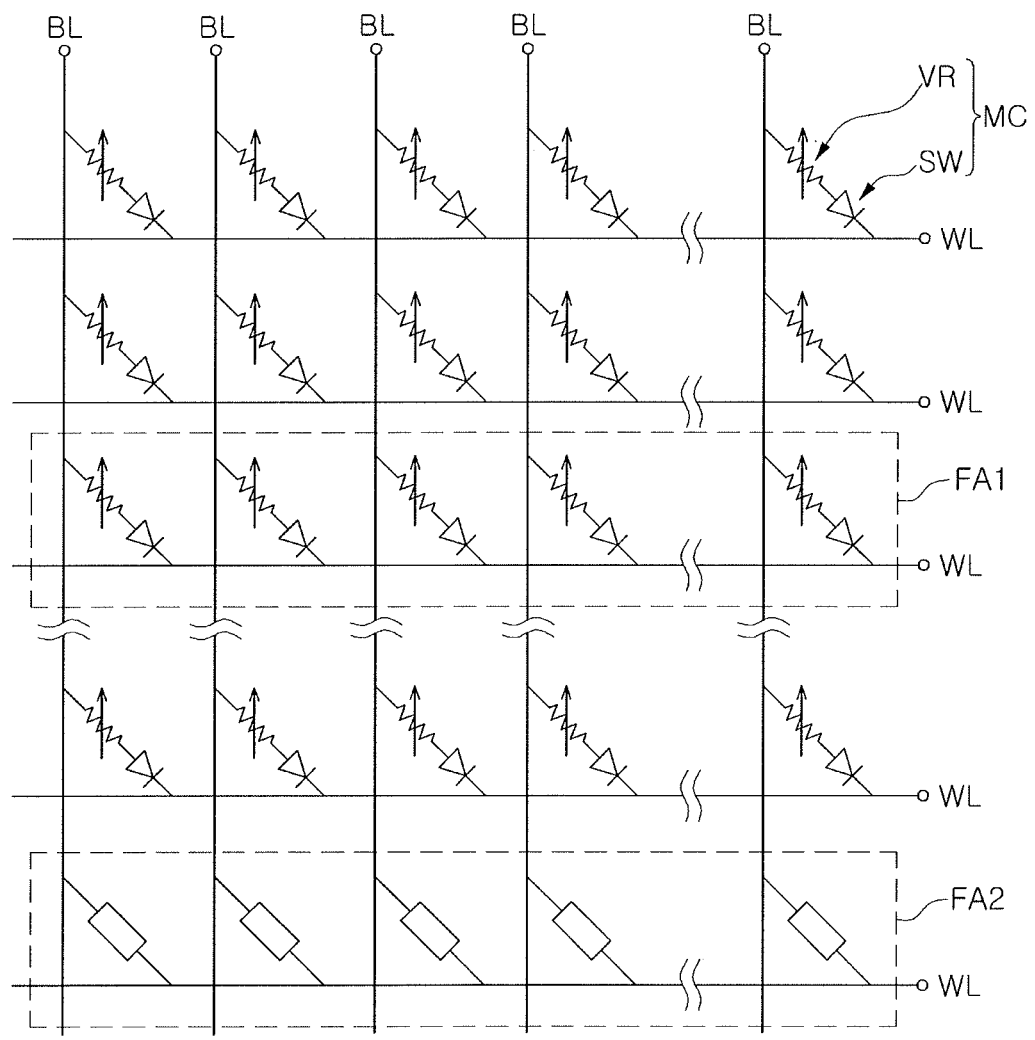

FIGS. 3 to 5 illustrate a memory cell array included in a memory device according to an example embodiment.

First, referring to FIG. 3, a memory cell array 100 according to an example embodiment may include a first fuse region 101, a second fuse region 102, a memory cell region 103, and the like. The first fuse region 101 includes a plurality of first fuse cells, while the second fuse region 102 may include a plurality of second fuse cells. The plurality of memory cells in the memory cell region 103 may have a structure the same as a structure of the plurality of first fuse cells and different from a structure of the plurality of second fuse cells.

In an example embodiment, the first fuse region 101 may be in a center of the memory cell array 100. In other words, the plurality of first fuse cells may be between the plurality of memory cells. Characteristics of memory cells according to a manufacturing process may be better at the center of the memory cell array 100 as compared with at boundaries or peripheries thereof. The first fuse cells in the first fuse region 101 may be used as redundancy memory cells for defective memory cells or may store data for customizing of a memory device. Thus, the first fuse cells are to be implemented as memory cells having excellent characteristics.

In an example embodiment, a portion of memory cells at the center of the memory cell array 100 may be selected as first fuse cells to provide a first fuse region 101. Moreover, in an example embodiment illustrated in FIG. 3, the second fuse region 102 may be adjacent, e.g., directly adjacent, to the first fuse region 101. The second fuse cells in the second fuse region 102 having a structure different from that of the memory cells, e.g., antifuse cells.

Next, referring to FIG. 4, a memory cell array 110 according to an example embodiment may include a first fuse region 111, a second fuse region 112, a memory cell region 113, and the like. In a manner similar to the example embodiment illustrated in FIG. 3, the plurality of first fuse cells in the first fuse region 111 may have a structure different from a structure of the plurality of second fuse cells in the second fuse region 112. The first fuse cells may be electrical fuse cells having a structure the same as a structure of the memory cells included in the memory cell region 113. The second fuse cells may have a structure different from a structure of the memory cells, e.g., antifuse cells.

In an example embodiment illustrated in FIG. 4, in order to select a portion among memory cells having relatively excellent characteristics as first fuse cells, the first fuse region 111 may be in the center of the memory cell array 110. The second fuse region 112 includes elements formed separately from the first fuse region 111 and may thus be separated from the first fuse region 111, e.g., in boundaries or periphery of the memory cell array 110.

FIG. 5 illustrates a memory cell array 120. Referring to FIG. 5, the memory cell array 120 according to an example embodiment may include a plurality of memory cells MC. Each of the plurality of memory cells MC may be provided at an intersection of a bit line BL and a word line WL. In other words, each of the plurality of memory cells MC may be connected to a single bit line BL and a single word line WL.

For example, each of the plurality of memory cells MC may include a switch element SW and a data storage element VR. In an example embodiment, the switch element SW may include at least one of a PN junction diode, a Schottky diode, a transistor, an ovonic threshold switch (OTS), and the like. In an example embodiment, the data storage element VR may be a phase change element, a magnetic tunnel junction (MTJ) element, a variable resistance element, and the like, including a chalcogenide material, a super-lattice material, and the like. In other words, the data storage element VR may store data according to a phase transition phenomenon, occurring in a phase-change element, change in a magnetization direction, occurring in an MTJ element, or changes in resistance, occurring in a variable resistor element. The data storage element VR and the switch element SW may be connected to each other in series.

The memory controller increases or decreases resistance of the data storage element VR, included in each of the plurality of memory cells MC, through the bit line BL and the word line WL, thereby writing or erasing data. The relationship between a resistance value of the data storage element VR and whether data is written may be variously defined.

In an example embodiment, when the data storage element VR includes a phase-change element, the memory controller may change a phase of a phase-change material from a crystalline phase to an amorphous phase to increase resistance of the data storage element VR, thereby writing data. In addition, the memory controller may change the phase of the phase-change material from the amorphous phase to the crystalline phase to decrease resistance of the data storage element VR, thereby erasing data.

In an example embodiment, when the data storage element VR includes an MTJ element, the memory controller adjusts a magnetization direction of a free layer included in the MTJ element to increase or decrease resistance of the data storage element VR, thereby writing or erasing data. The memory controller compares a read voltage, detected by the plurality of memory cells MC, with a predetermined reference voltage, thereby performing a reading operation to read data, stored in the plurality of memory cells MC.

Referring to FIG. 5, the memory cell array 120 may include a first fuse region FA1 and a second fuse region FA2. The first fuse region FA1 may include some memory cells in the center of the memory cell array 120 as first fuse cells. In other words, the first fuse cells may be between the memory cells MC. The first fuse cells may have a structure the same as a structure of the memory cells MC. The first fuse cells may have a structure in which the data storage element VR and the switch element SW are connected in series. The memory controller may write or erase data on the first fuse cells using the same method for writing or erasing data to the memory cells MC.

In an example embodiment illustrated in FIG. 5, the second fuse region FA2 may be separated from the first fuse region FA1, e.g., with memory cells MC therebetween. A position of the second fuse region FA2 may be variously changed. The second fuse cells in the second fuse region FA2 may have a structure different from a structure of the first fuse cells. For example, the second fuse cells may have transistor elements, connected to each other in series. In an example embodiment, the memory controller may destroy at least one gate insulating layer among transistor elements included in each of the second fuse cells to write data. For example, data, once written to the second fuse cells, may not be erased or changed.

In an example embodiment, the first fuse cells may have data freely written and erased in a manner similar to that of the memory cells MC. The second fuse cells may store data that is difficult to erase or change once the data is written, to improve reliability and performance of a memory device. For example, after data for a repair process and/or customizing of a memory device is written to first fuse cells and a test procedure is performed, data stored in the first fuse cells may be written to the second fuse cells before shipment. Data stored in the second fuse cells is not erased or changed by a process after a test procedure. Thus, reliability and a performance of a memory device may be improved.

Figure 6:
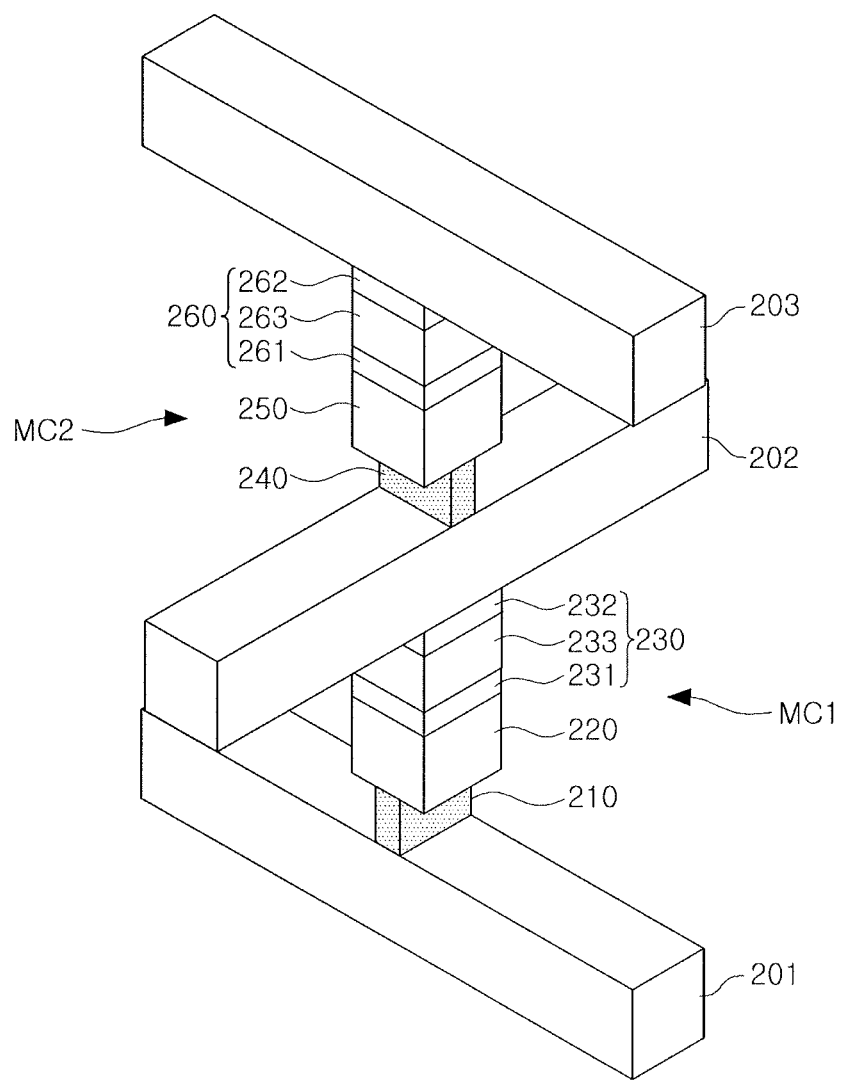
FIGS. 6 and 7 illustrate a memory cell included in a memory device according to an example embodiment.
Figure 7:
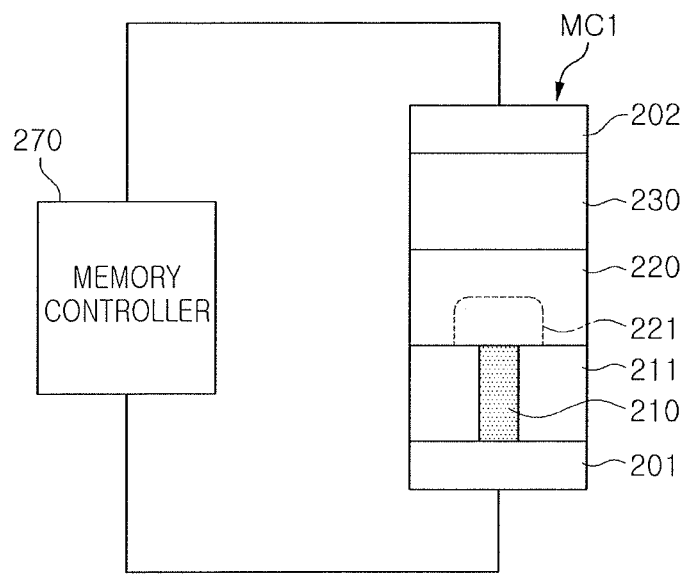

FIGS. 6 and 7 illustrate a memory cell included in a memory device according to an example embodiment.

Referring to FIG. 6, a memory device 200 according to an example embodiment may include a first memory cell MC1 and a second memory cell MC2 between a plurality of conductive lines 201 to 203. Each of the first memory cell MC1 and the second memory cell MC2 may be operated as an independent memory cell. For example, when a first conductive line 201 and a third conductive line 203 are word lines, a second conductive line 202 may be a bit line. Moreover, when the first conductive line 201 and the third conductive line 203 are bit lines, the second conductive line 202 may be a word line. Hereinafter, for convenience of explanation, it is assumed that the first conductive line 201 and the third conductive line 203 are a first word line and a second word line, respectively, while the second conductive line 202 is a bit line.

The first memory cell MC1 may include a first heating electrode 210, a first data storage element 220, a first switch element 230, and the like. The first switch element 230 may include a first switch electrode 231 and a second switch electrode 232, as well as a first selective layer 233 therebetween, and the like. In an example embodiment, the first selective layer 233 may include an ovonic threshold switch (OTS) material. When a voltage higher than a threshold voltage is applied between the first switch electrode 231 and the second switch electrode 232, a current may flow through the first selective layer 233.

The first data storage element 220 may include a phase-change material, and may include a chalcogenide material, by way of example. For example, the first data storage element 220 may include Ge—Sb—Te (GST), and a crystallization temperature of the first data storage element 220, a melting point, and a phase-change rate according to crystallization energy may be determined depending on a type of elements included in the first data storage element 220 and a chemical composition ratio thereof.

The second memory cell MC2 may have a structure similar to a structure of the first memory cell MC1. Referring to FIG. 6, the second memory cell MC2 may include a second heating electrode 240, a second data storage element 250, a second switch element 260, and the like. A structure and the characteristics of each of the second heating electrode 240, the second data storage element 250, and the second switch element 260 may be similar to those of each of the first heating electrode 210, the first data storage element 220, and the first switch element 230. Hereinafter, with reference to the first memory cell MC1, a method of writing and erasing data will be described.

Referring to FIG. 7, a memory controller 270 may write data to the first memory cell MC1 or may erase data of the first memory cell MC1. When a voltage and/or a current is applied through the first word line 201 and the bit line 202, Joule heat due to the voltage may occur at an interface between the first heating electrode 210 and the first data storage element 220. Due to the Joule heat, a phase-change material in the first data storage element 220 may be changed from an amorphous phase to a crystalline phase or may be changed from a crystalline phase to an amorphous phase. The first data storage element 220 may have high resistance in an amorphous phase and may have low resistance in a crystalline phase. In an example embodiment, depending on a resistance value of the first data storage element 220, data '0' or '1' may be defined.

For example, in order to write data on the first memory cell MC1, the memory controller 270 may supply a program voltage through the first word line 201 and the bit line 202. The program voltage may be higher than a threshold voltage of an ovonic threshold switch material included in the first switch element 230. Thus, a current may flow through the first switch element 230. Due to the program voltage, the phase-change material in the first data storage element 220 may be changed from an amorphous phase to a crystalline phase, thereby writing data to the first memory region. In an example embodiment, when the phase-change material in the first data storage element 220 has a crystalline phase, a state of the first memory cell MC1 may be defined as a set state.

Meanwhile, in order to erase data written on the first memory cell MC1, the memory controller 270 may supply a predetermined erase voltage through the first word line 201 and the bit line 202. Due to the erase voltage, the phase-change material in the first data storage element 220 may be phase-changed from a crystalline phase to an amorphous phase. When the phase-change material, included in the first data storage element 220, has an amorphous phase, a state of the first memory cell MC1 may be defined as a reset state. For example, a maximum value of the erase voltage may be greater than a maximum value of the program voltage, and the time during which the erase voltage is supplied may be shorter than the time during which the program voltage is supplied.

As described above, a resistance value of the data storage elements 220 and 250 may be changed according to a state of a phase-change material included in the data storage elements 220 and 250, and the memory controller may distinguish data '0' and '1' from resistance of the data storage elements 220 and 250. The state of the phase-change material included in the data storage elements 220 and 250 may be changed by Joule heat occurring at an interface between the heating electrodes 210 and 240 and the data storage elements 220 and 250. Thus, in addition to a voltage or a current, input by the memory controller 270, due to various external factors occurring in a process of manufacturing the memory device 200, a test procedure, use environment, or the like, a state of the phase-change material included in the data storage elements 220 and 250 may be changed.

As described above, the memory device 200 according to an example embodiment may include first fuse cells and second fuse cell. The first fuse cells may have a structure the same as a structure of the memory cells MC1 and MC2. The memory controller 270 may write or erase data on the first fuse cells using the same method as for writing or erasing data to the memory cells MC1 and MC2.

However, data stored in the first fuse cells may be unintentionally deleted or changed by a process for manufacturing the memory device 200, a test procedure, use environment, or the like. In an example embodiment, in order to solve the problem caused by unintentional deletion and/or change of data stored in first fuse cells, second fuse cells may be used. The second fuse cells may be antifuse cells having a structure different from a structure of the first fuse cells. The memory controller 270 may write data of the first fuse cells to the second fuse cells after a test procedure is completed. Regardless of a manufacturing process, a test procedure, use environment, or the like, the second fuse cells may stably store data, thereby improving reliability and a performance of the memory device 200.

Figure 8:
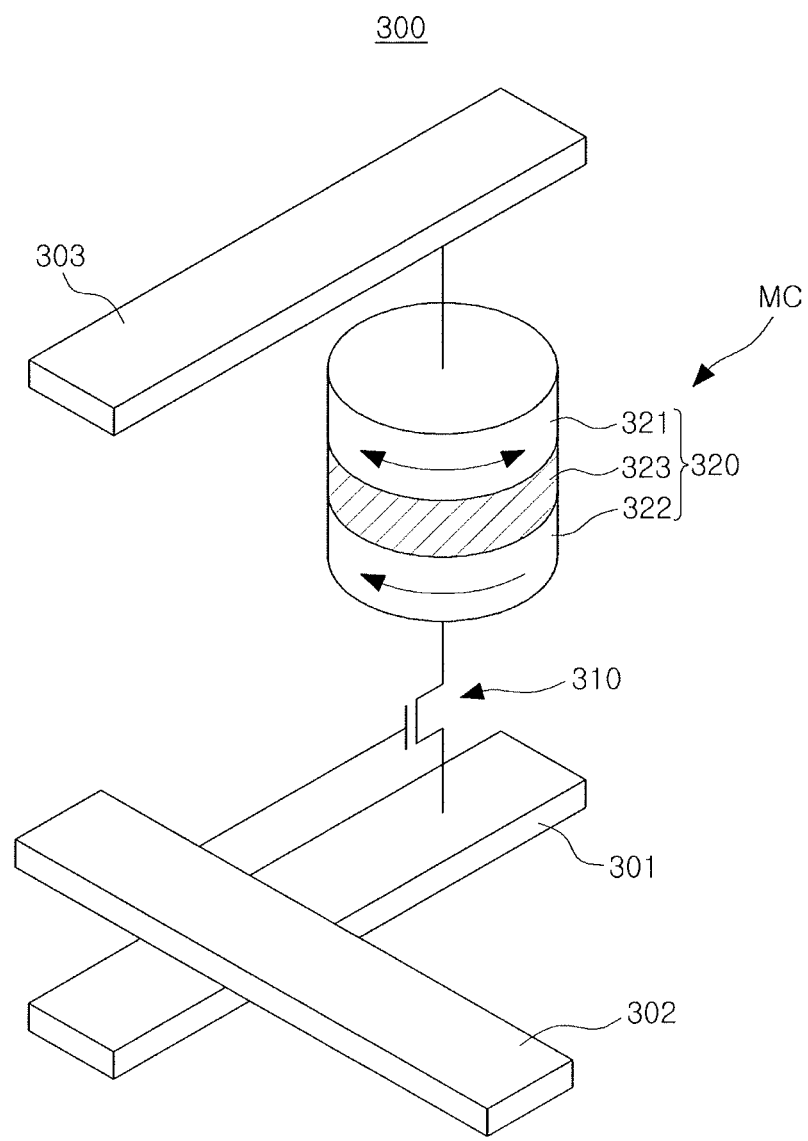
FIGS. 8 and 9 illustrate a memory cell included in a memory device according to an example embodiment.
Figure 9:
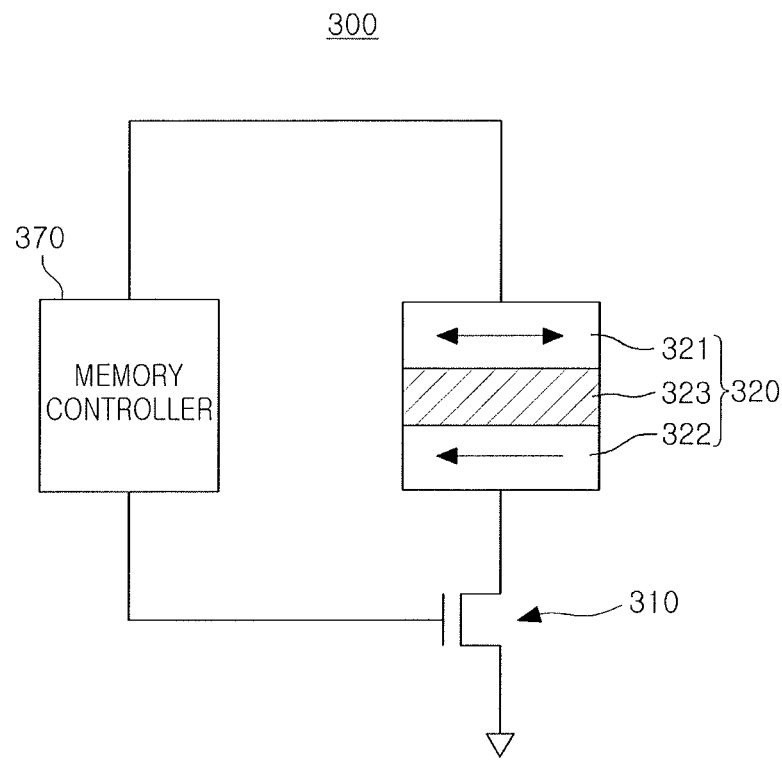

FIGS. 8 and 9 illustrate a memory cell included in a memory device according to an example embodiment.

Referring to FIG. 8, a memory cell MC of a memory device may include a switch element 310 and a data storage element 320. The switch element 310 may be implemented as a transistor having a gate terminal connected to a word line 302. One of source/drain electrodes of the switch element 310 is connected to the source line 301 and the other one is connected to the bit line 303 through the data storage element 320.

The data storage element 320 may include an MTJ element. The MTJ element may include a free layer 321 and a fixed layer 322, as well as a tunnel layer 323 therebetween. A magnetization direction of the fixed layer 322 is fixed, i.e., unchanging, and a magnetization direction of the free layer 321 may be changed in the same or opposite direction as the fixed layer 322 depending on conditions. In order to fix a magnetization direction of the fixed layer 322, an anti-ferromagnetic layer may be further included in the data storage element 320.

Referring to FIG. 9, the memory controller 370 adjusts a magnetization direction of the free layer 321 in the data storage element 320 to change resistance of the data storage element 320, thereby writing data or erasing data to the data storage element 320. For example, the memory controller 370 turns-on the switch element 310 and inputs a current or a voltage to the data storage element 320, thereby determining a magnetization direction of the free layer 321 to be the same as a structure of the fixed layer 322. For example, as a current is input from the free layer 321 to the fixed layer 322, free electrons, having a spin direction the same as a structure of the fixed layer 322, apply torque to the free layer 321, so the free layer 321 may be magnetized in parallel with the fixed layer 322.

On the other hand, when a current, flowing in a direction from the fixed layer 322 of the data storage element 320 to the free layer 321, is input, free electrons, having a spin in a direction opposite to that of the fixed layer 322, may apply torque to the free layer 321. Thus, the free layer 321 may be magnetized in anti-parallel with the fixed layer 322.

When the free layer 321 and the fixed layer 322 are magnetized in parallel with each other, the data storage element 320 has relatively small resistance. Alternatively, when the free layer 321 and the fixed layer 322 are magnetized in anti-parallel with each other, the data storage element 320 has relatively high resistance. For example, the memory controller 370 may read data using a voltage detected by the memory cell MC according to a magnitude of a resistance value of the data storage element 320 by inputting a read current. For example, data '0' may be read when resistance of the data storage element 320 is small, and data '1' may be read when resistance of the data storage element 320 is large.

When the data storage element 320 includes an MTJ element, data that is stored in first fuse cells (having a structure the same as a structure of the memory cell MC in FIG. 8) may be unintentionally deleted or changed by an effect of a magnetic field occurring in a test procedure, a manufacturing process, use environment, or the like. In an example embodiment, in order to solve the problem described above, after a test procedure that may require updating or intentionally changing the data stored in the first fuse cells is terminated, data of the first fuse cells may be written to the second fuse cells, e.g., antifuse cells. Thus, after fabrication is finished (fab-out), regardless of a subsequent test procedure, a manufacturing process, use environment, or the like, data to be stored in fuse cells may be stably maintained.

Figure 10:
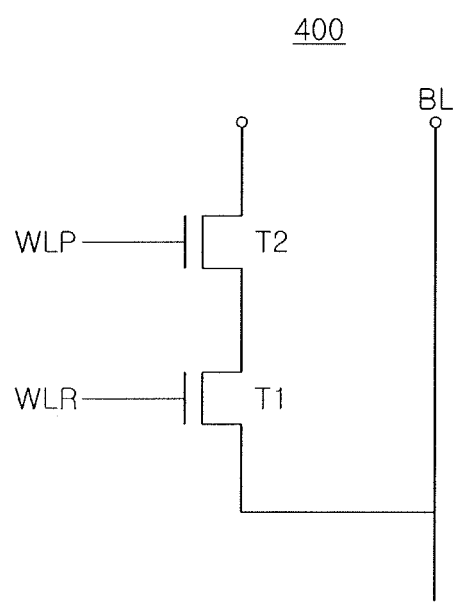
FIGS. 10 and 11 illustrate a second fuse cell included in a memory device according to an example embodiment in different states.
Figure 11:
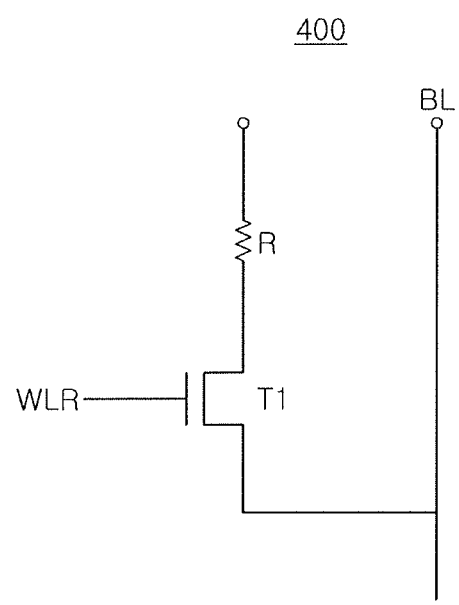

FIGS. 10 and 11 illustrate a second fuse cell included in a memory device according to an example embodiment in different states.

An anti-fuse cell, described with reference to FIGS. 10 and 11, may be applied as a second fuse cell 400 to a memory device according to an example embodiment. A memory controller may store data of a first fuse cell having a structure the same as a structure of memory cells in the second fuse cell 400 when a test procedure, or the like, is terminated after fabrication is finished (fab-out).

Referring to FIG. 10, a second fuse cell 400 may include a first transistor T1 and a second transistor T2. For example, the first transistor T1 may be a read transistor, while the second transistor T2 may be a program transistor. A gate electrode of the first transistor T1 may be connected to a read word line WLR, while a gate electrode of the second transistor T2 may be connected to a program word line WLP.

A memory controller inputs a program voltage to a gate electrode of the second transistor T2 through the program word line WLP to destroy a gate insulating film of the second transistor T2, thereby reducing resistance of the second transistor T2. Referring to FIG. 11, in order to illustrate a state in which the gate insulating film of the second transistor T2 is destroyed the second transistor T2 is essentially replaced with a resistor R and may not be reconfigured as the second transistor T2.

In a state in which a gate insulating film of the second transistor T2 is destroyed, a predetermined voltage is input between a gate electrode of the second transistor T2 and a bit line BL. Here, when an operating voltage is applied to a gate electrode of the first transistor T1, a relatively large current may flow in the bit line BL. On the other hand, in a state in which a gate insulating film of the second transistor T2 is not destroyed, when an operating voltage is applied to the gate electrode of the first transistor T1, due to high resistance of the second transistor T2, a relatively small current may flow in the bit line BL. As described above, the memory controller inputs a high program voltage to the second transistor T2 through the program word line WLP to destroy a gate insulating film of the second transistor T2, thereby writing desired data to the second fuse cell 400.

Figure 12:
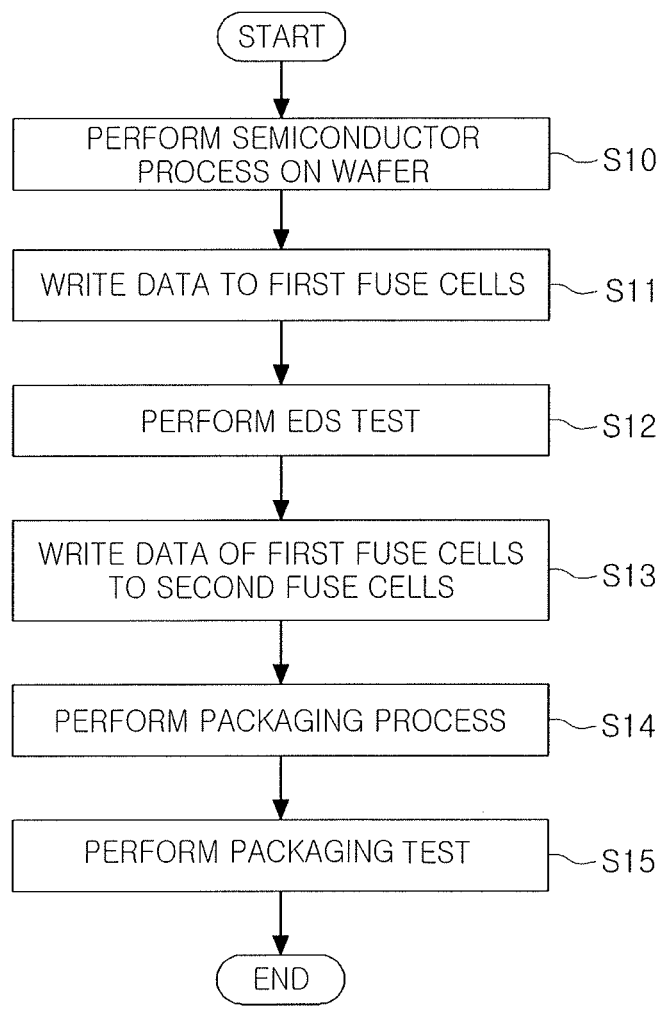
FIG. 12 illustrates a flowchart of a method for manufacturing a memory device according to an example embodiment.

FIG. 12 illustrates a flowchart of a method of manufacturing a memory device according to an example embodiment.

Referring to FIG. 12, a method for manufacturing a memory device according to an example embodiment may begin by performing a semiconductor process for manufacturing a memory device on a wafer (S10). The wafer may include a plurality of chip regions in which a plurality of memory devices are formed, a scribing region for separating the plurality of chip regions, and the like.

When the semiconductor process is completed and fabrication is finished (fab-out) for the wafer, the memory controller may write data to first fuse cells (S11). The data may include redundancy related data for replacing memory cells, in which a defect occurs, with first fuse cells, data for customizing of a memory device, and the like. For example, the memory controller may replace a word line and a bit line connected to a defective memory cell with a word line and a bit line connected to first fuse cells. Moreover, data, for customizing an operating voltage of a memory device, operation timing, or the like, due to an error occurring in a manufacturing process, may be stored in first fuse cells. The first fuse cells may have a structure the same as a structure of the memory cells and may store data using changes in resistance.

After the data is stored in the first fuse cells, a wafer is transferred to a test procedure and an electrical die sorting (EDS) test may be performed (S12). For example, the EDS test may be performed multiple times with varying temperature conditions. While the EDS test is performed, customizing data for securing performance of a memory device may be intentionally changed. As the memory controller changes the data stored in the first fuse cells, the EDS test may be performed while customizing data stored in the first fuse cells is changed.

When the EDS test is completed, the memory controller may write data of the first fuse cells to the second fuse cells (S13). The second fuse cells may have a structure different from that of the memory cells, e.g., antifuse cells, and may be written in a manner different from that of the first fuse cells. Thus, the data written to the second fuse cells in S13 may not be changed or deleted unintentionally by an assembly process or use environment, after the EDS test.

When the data is written to the second fuse cells, a packaging process and a package test for a memory device produced by the packaging process may be performed (S14 and S15). In an environment in which a packaging process and a package test are performed, the data stored in the second fuse cells, may not be changed or deleted. Thus, reliability of a memory device is improved and stable performance may be secured.

Figure 13:
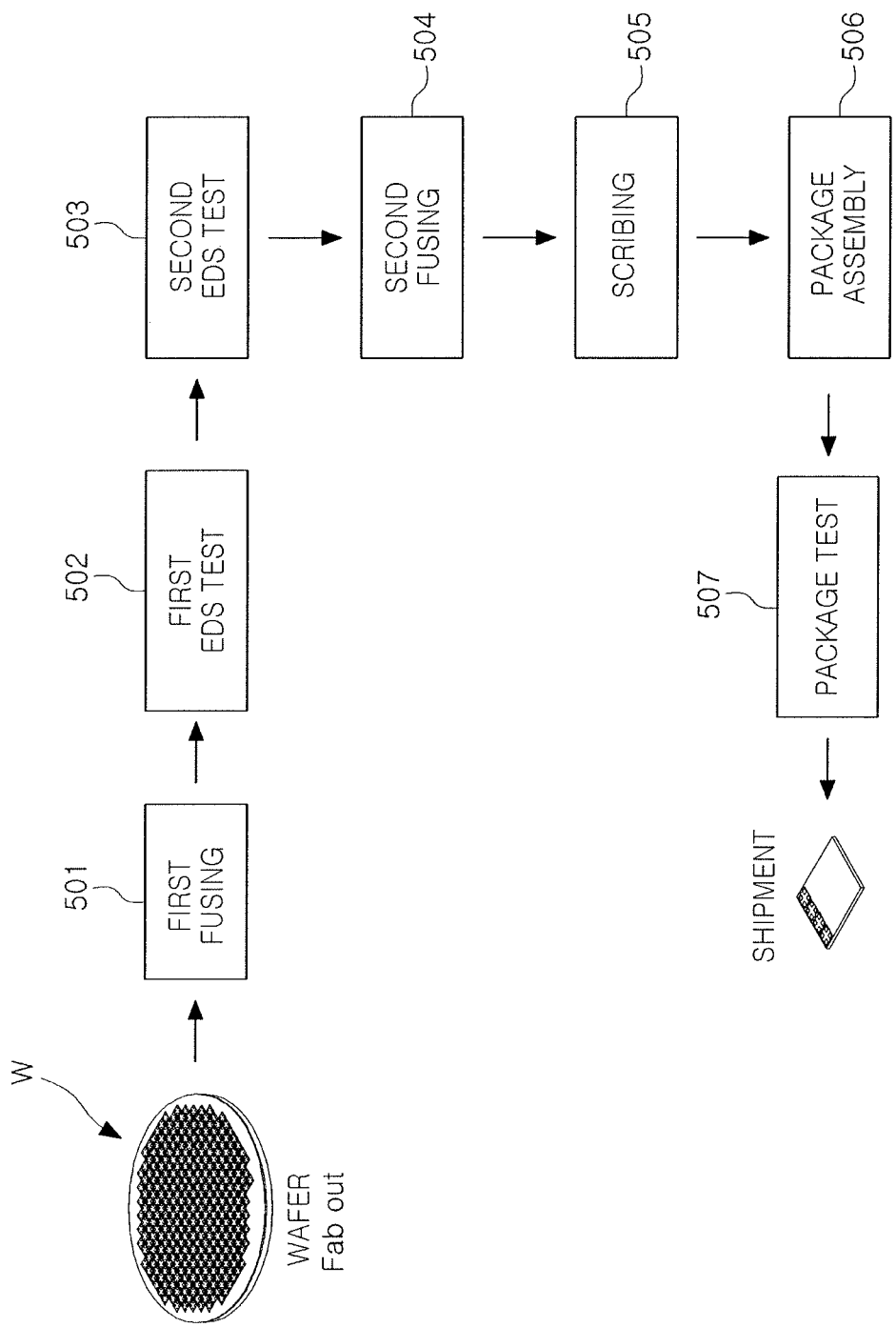
FIG. 13 illustrates a process for manufacturing a memory device according to an example embodiment.

FIG. 13 illustrates a process for manufacturing a memory device according to an example embodiment. Referring to FIG. 13, semiconductor processes are applied to a wafer W to produce a plurality of semiconductor dies, and the wafer W fabrication may be finished (fab-out). The plurality of semiconductor dies in the wafer W may include a memory device.

When the wafer W fabrication is finished (fab-out), first fusing 501 for writing data to the first fuse cells in the memory cell array may be performed. The first fuse cells may have a structure the same as that of general memory cells in the memory cell array. The first fusing 501 may include storing data for customizing a memory device in the first fuse cells or a repair operation of replacing defective memory cells using at least a portion among the first fuse cells as a redundancy memory cell.

After the first fusing 501 is completed, a first EDS test 502 and a second EDS test 503 may be sequentially performed. For example, the first EDS test 502 may be performed in a relatively high temperature environment and the second EDS test 503 may be performed in a relatively low temperature environment. While the first EDS test 502 and the second EDS test 503 are performed to optimize a performance of a memory device, customizing data stored in the first fuse cells may be changed in accordance therewith to be optimized.

After the EDS tests 502 and 503 are completed, second fusing 504 may be performed. The second fusing 504 may include writing repair data and customizing data determined by the EDS tests 502 and 503 in the second fuse cells. The repair data may include data for replacing defective memory cells using at least a portion among the first fuse cells. The second fuse cells may include anti-fuse cells and data stored in the first fuse cells may be written to the second fuse cells by the second fusing 504. Alternatively, repair data and customizing data determined by the EDS tests 502 and 503 may be written to the second fuse cells during the second fusing 504 without reference to data stored in the first fuse cells. In an example embodiment, the second fusing 504 may include a repair operation of replacing defective memory cells using at least a portion of the first fuse cells as redundancy memory cells.

When the second fusing 504 is completed, a scribing process 505 is applied to separate semiconductor dies including a memory device from the wafer W and then a package assembly process 506 may be applied. When a memory package is produced to by the package assembly process 506, after a package test 507 is performed, the memory package may be shipped.

In the series of processes described with reference to FIG. 13, a repair operation and customizing of a memory device may be primarily performed using first fuse cells. However, the first fuse cells may have a structure the same as that of memory cells according to the related art, and data thereof may be deleted or changed while passing through the scribing process 505, the package assembly process 506, the package test 507, and the like. In an example embodiment, after data is written to the first fuse cells and the EDS tests 502 and 503 are performed to secure data for a repair operation and customizing, data in the first fuse cells may be written to second fuse cells. The data of the second fuse cells is not deleted or changed by the scribing process 505, the package assembly process 506, the package test 507, and the like, so reliability and an operation performance of a memory device may be improved.

Figure 14:
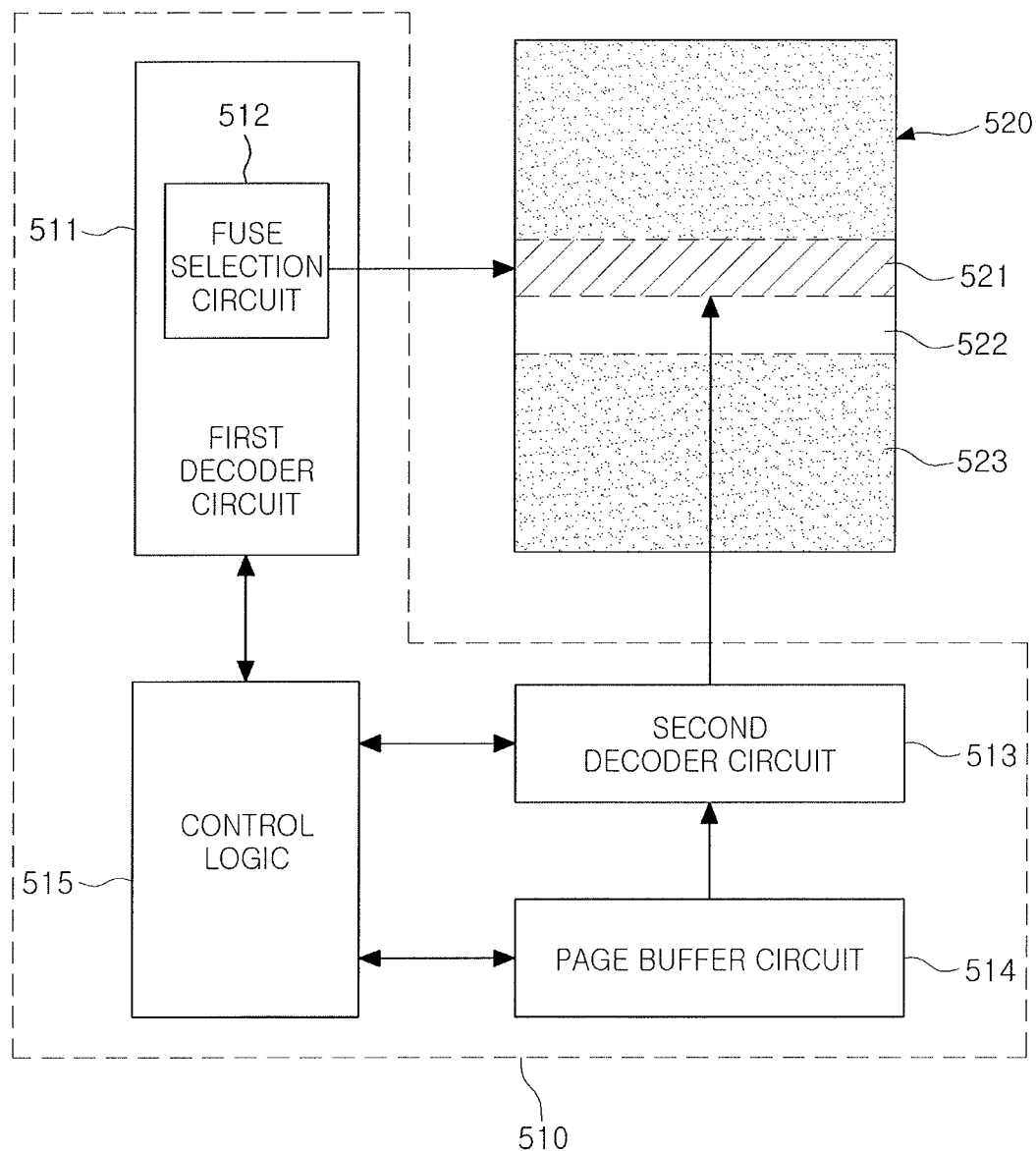
FIGS. 14 to 16 illustrate a data storage operation of fuse cells according to an example embodiment memory device.
Figure 15:
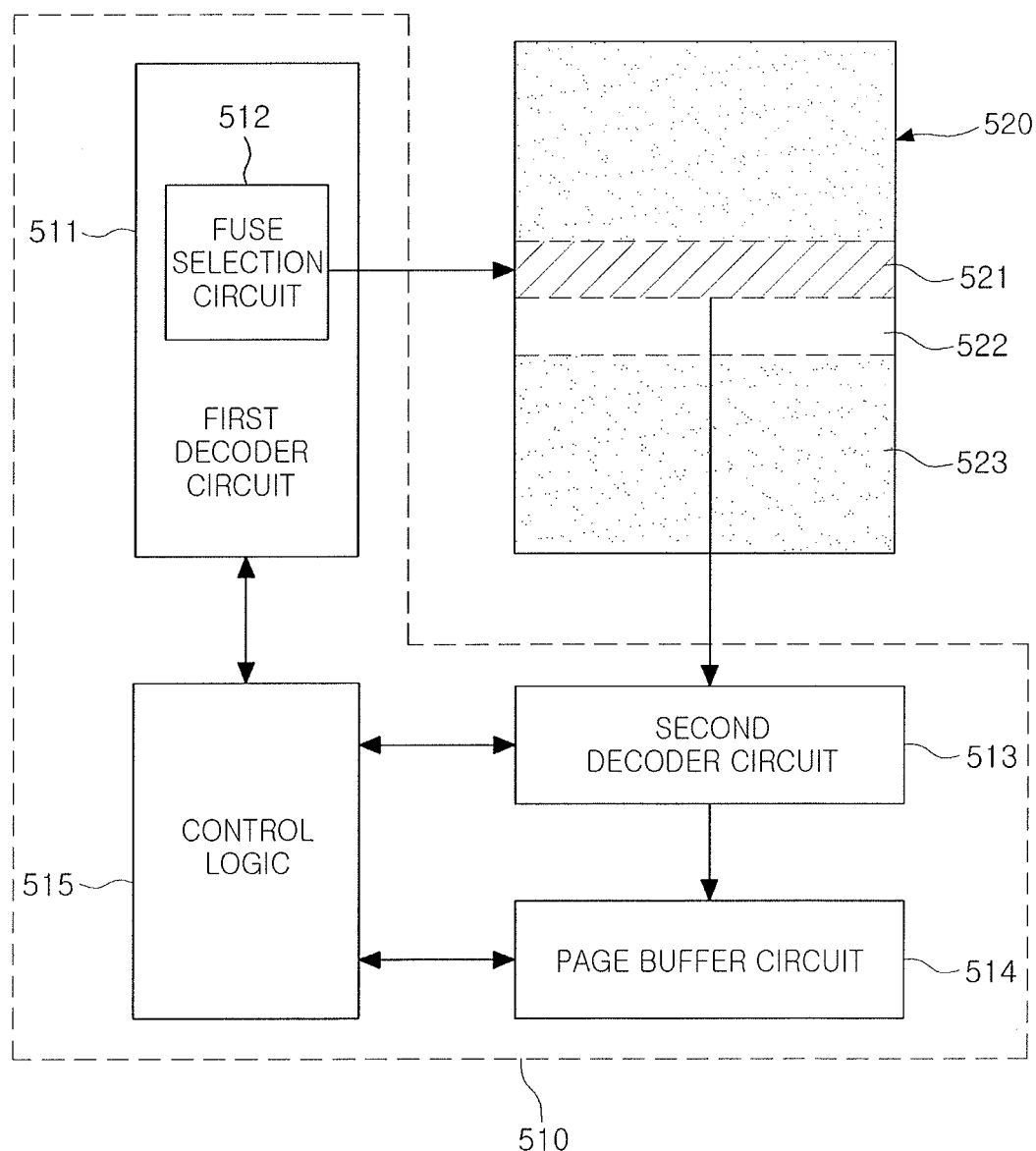
Figure 16:
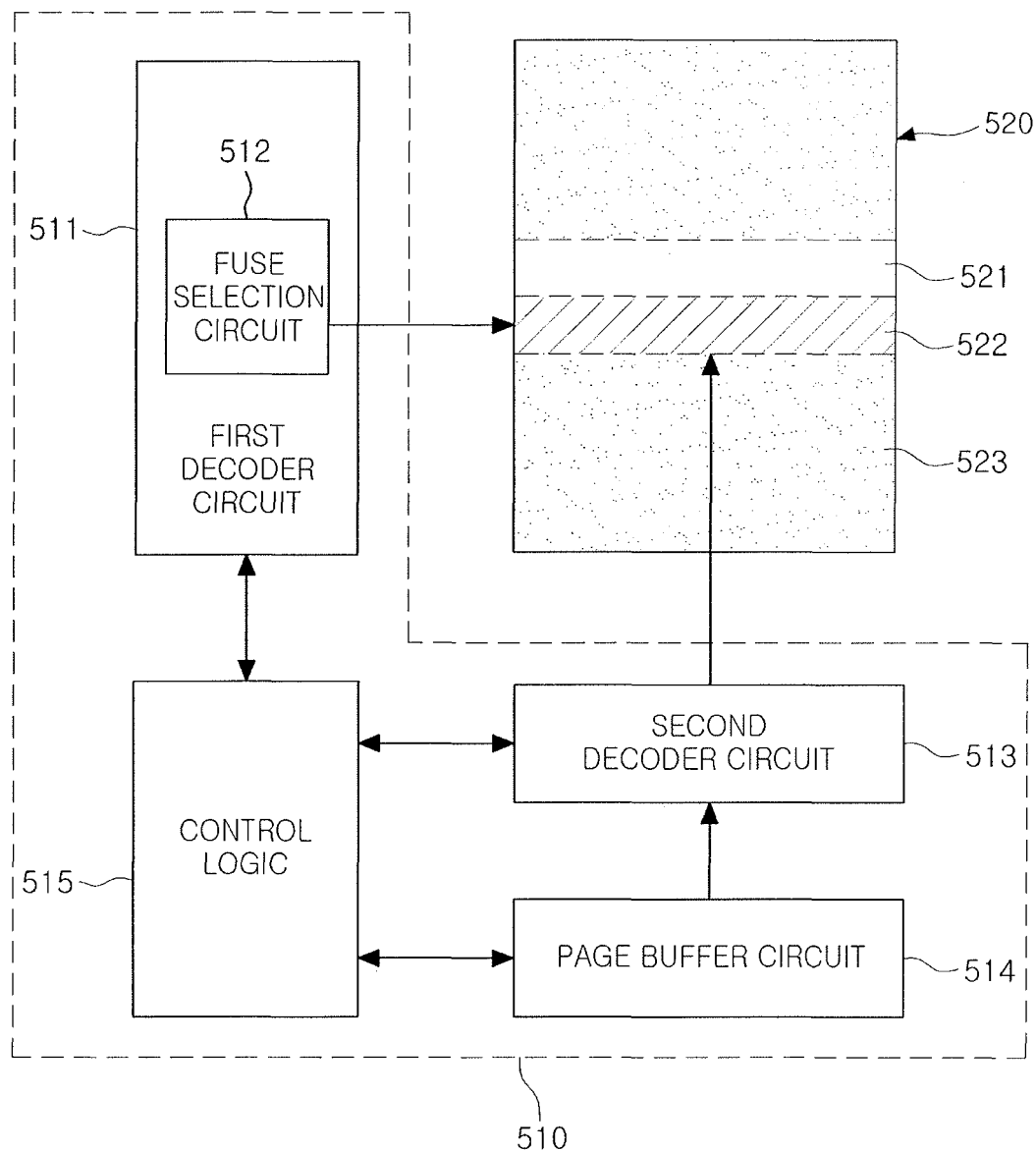

FIGS. 14 and 16 are drawings illustrating a data storage operation of fuse cells in a memory device according to an example embodiment. Referring to FIGS. 14 to 16, a memory device 500 according to an example embodiment may include a memory controller 510 and a memory cell array 520. The memory cell array 520 according to an example embodiment may include a first fuse region 521, a second fuse region 522, a memory cell region 523, and the like.

First, referring to FIG. 14, the memory device 500 may perform first fusing to write data to first fuse cells of the first fuse region 521. The data written to the first fuse cells by the first fusing may include data for customizing the memory device 500, repair data for replacing defective memory cells with at least a portion among the first fuse cells, data related to production/manufacture history of the memory device 500, and the like.

While the first fusing is performed, the fuse selection circuit 512 in the first decoder circuit 511 may select the first fuse region 521 rather than the second fuse region 522. Thus, the data input by the page buffer circuit 514 and the second decoder circuit 513 may be written to the first fuse region 521, rather than the second fuse region 522. Whether the fuse selection circuit 512 selects the first fuse region 521 or the second fuse region 522 may be determined by the control logic 515.

Referring to FIG. 15, after the first fusing and the EDS test are completed, the control logic 515 may read data stored in the first fuse region 521. For example, the data, stored in the first fuse region 521 may be optimized during by the first fusing through the EDS tests. The data read from the first fuse region 521 may be stored in a separate storage space provided inside/outside of the page buffer circuit 514 or the memory device 500.

Next, referring to FIG. 16, the control logic 515 may write the data read from the first fuse region 521 to the second fuse region 522. The second fuse cells in the second fuse region 522 may be antifuse cells. For example, the data, written to the second fuse cells by the data writing operation according to an example embodiment illustrated in FIG. 16, may not be deleted or changed.

The control logic 515 may control the fuse selection circuit 512 to select the second fuse region 522. When the fuse selection circuit 512 selects the second fuse region 522, the page buffer circuit 514 inputs data read from the first fuse region 521 to write the data to the second fuse cells. For example, the data writing operation, described with reference to FIG. 16, may include a process in which a gate insulating film of a program transistor included in each of second fuse cells is destroyed. To transfer the data written to the first fuse cells to the second fuse cells to be stored, the number of second fuse cells may be greater than or the same as the number of first fuse cells.

Figure 17:
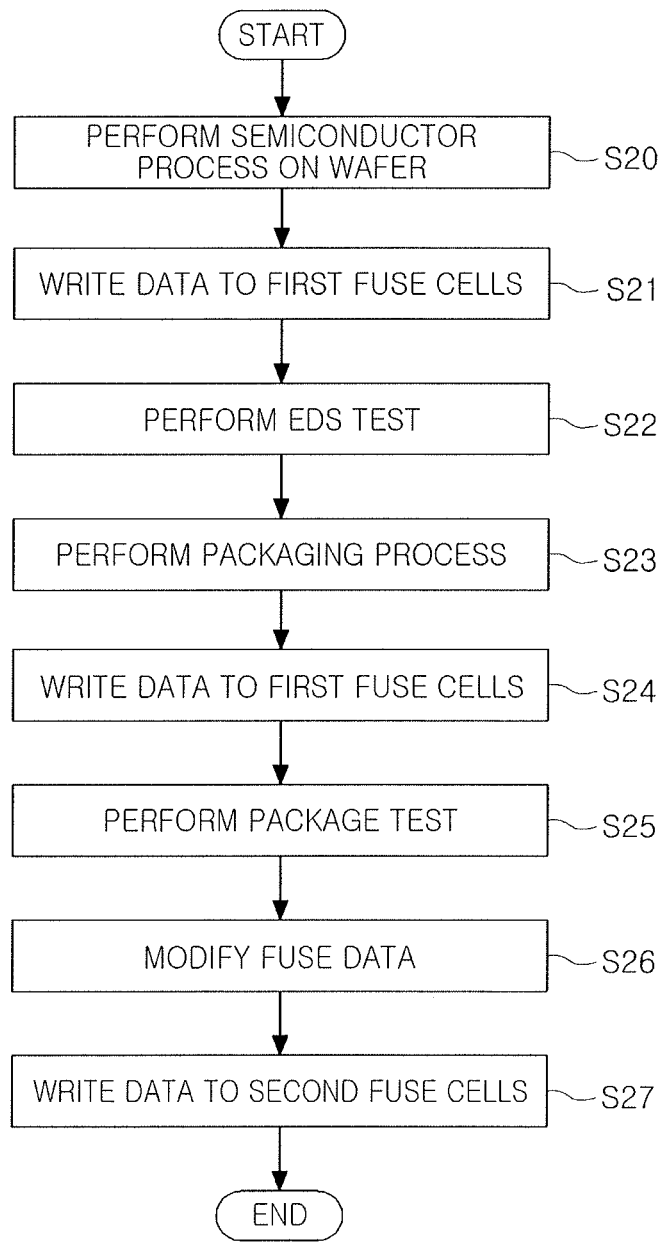
FIG. 17 illustrates a flowchart of a method for manufacturing a memory device according to an example embodiment.

FIG. 17 illustrates a flowchart of a method of manufacturing a memory device according to an example embodiment.

Referring to FIG. 17, a method for manufacturing a memory device according to an example embodiment may begin by performing a semiconductor process for manufacturing a memory device on a wafer (S20). The wafer may include a plurality of chip regions in which a plurality of memory devices are formed, a scribing region for separating the plurality of chip regions, and the like.

After the semiconductor process is completed and fabrication is finished (fab-out) for the wafer, the memory controller may write data to first fuse cells (S21). The data written to the first fuse cells may include repair data for replacing memory cells in which a defect occurs using at least a portion among first fuse cells as redundancy memory cells, data for customizing a memory device, data related to production/manufacture history of a memory device, and the like. The first fuse cells may have a structure the same as that of the memory cells and may store data using changes in resistance.

When the data is stored in the first fuse cells, an EDS test for the wafer may be performed (S22). The EDS test may include a first EDS test conducted under a high temperature condition, and a second EDS test conducted under a low temperature condition. While the EDS test is performed, customizing data for securing a performance of a memory device may be changed, and the EDS test may be performed while the memory controller optimizes customizing data stored in first fuse cells.

When the EDS test is completed, a packaging process for packaging a memory device may be performed (S23). The packaging process may include a scribing process for separating a semiconductor die including a memory device from a wafer, an assembly process for packaging a semiconductor die, and the like.

When the packaging process is completed, the memory controller may write data to the first fuse cell in response to a command transmitted from the outside (S24). Since the data written to the first fuse cells in the packaging process may be unintentionally changed or deleted, data may be rewritten to the first fuse cells after the packaging process is completed. The data rewritten to the first fuse cells in S24 may be the data adjusted by the EDS test previously conducted.

By using the data stored in first fuse cells, a package test for a package including a memory device may be performed (S25). Referring to the result of the package test, the data stored in the first fuse cells may be modified (S26). In other words, in an example embodiment described with reference to FIG. 17, a package test is performed on the data stored in the first fuse cells. When the package test is completed, the data stored in the first fuse cells may be written to the second fuse cells (S27). As described above, the second fuse cells may include anti-fuse cells.

Figure 18:
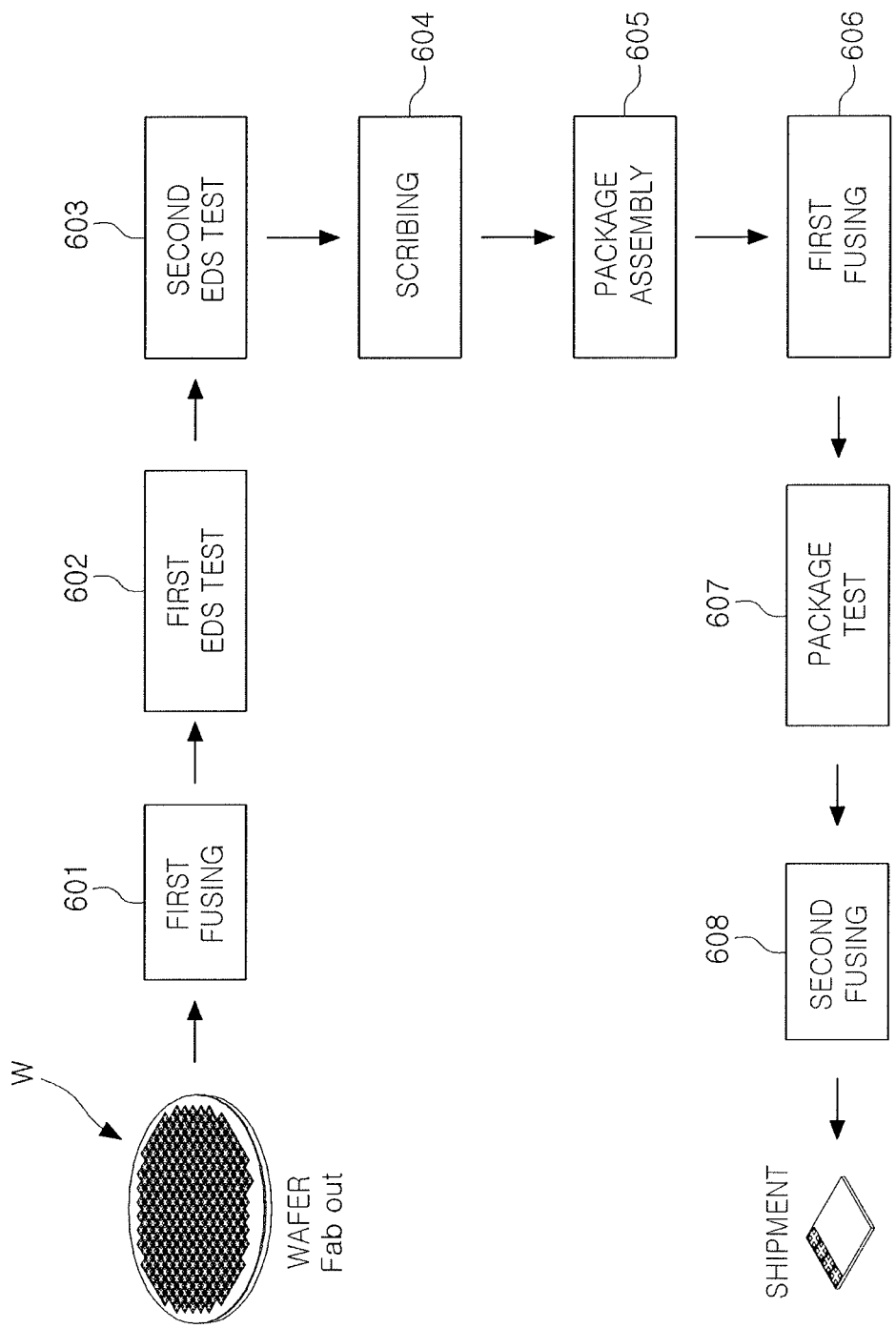
FIG. 18 illustrates a process for manufacturing a memory device according to an example embodiment.

FIG. 18 illustrates a process for manufacturing a memory device according to an example embodiment. Referring to FIG. 18, semiconductor processes are applied to a wafer W to produce a plurality of semiconductor dies, and the fabrication of the wafer W may be finished (fab-out). In an example embodiment, the plurality of semiconductor dies, included in the wafer W, may include a memory device.

When the wafer W fabrication is finished (fab-out), first fusing 601 for writing data to the first fuse cells in the memory cell array, may be performed. The first fuse cells may have a structure the same as that of general memory cells in the memory cell array. The data written to the first fuse cells by the first fusing may include customizing data, repair data, data related to production/manufacture history of a memory device, and the like.

When the first fusing 601 is completed, a first EDS test 602 and a second EDS test 603 may be sequentially performed. The first EDS test 602 is performed in a relatively high temperature environment and the second EDS test 603 may be performed in a relatively low temperature environment. When the EDS tests 602 and 603 are completed, a scribing process 604 for separating semiconductor dies, and a package assembly process 605 may be performed.

When the package assembly process 605 is completed, the first fusing 606 may be performed again. In the first fusing 606 after the package assembly process 605, customizing data, repair data, and data related to production/manufacture history of a memory device may be written to the first fuse cells, again. The data written to the first fuse cells in the first fusing 606 may be used in a package test 607.

In the package test 607, a test may be performed using a memory device in which the package assembly process 605 is completed. While the package test 607 is performed, the data, for customizing of a memory device and repair, may be modified, and the modified data may be reflected in the first fuse cells. When the package test 607 is completed, second fusing 608, in which the data, stored in the first fuse cells, is transferred to the second fuse cells to be written, may be performed. Alternatively, regardless of data stored in the first fuse cells, repair data and customizing data determined by the EDS tests 602 and 603 are written to the second fuse cells in the second fusing 608. The data, written to the second fuse cells by the second fusing 608, may not be deleted or changed regardless of user's intention thereafter. In an example embodiment, the second fusing 608 may include a repair operation of replacing defective memory cells using at least a portion among the first fuse cells as redundancy memory cells.

In an example embodiment illustrated in FIG. 18, the second fusing 608 may be performed after the package test 607. After the package assembly process 605 is completed, the data stored in the first fuse cells may be modified and/or changed, and customizing data and repair data of a memory device may be modified while the package test 607 is performed. Thus, reliability and a performance of a memory device may be further effectively secured.

Figure 19:
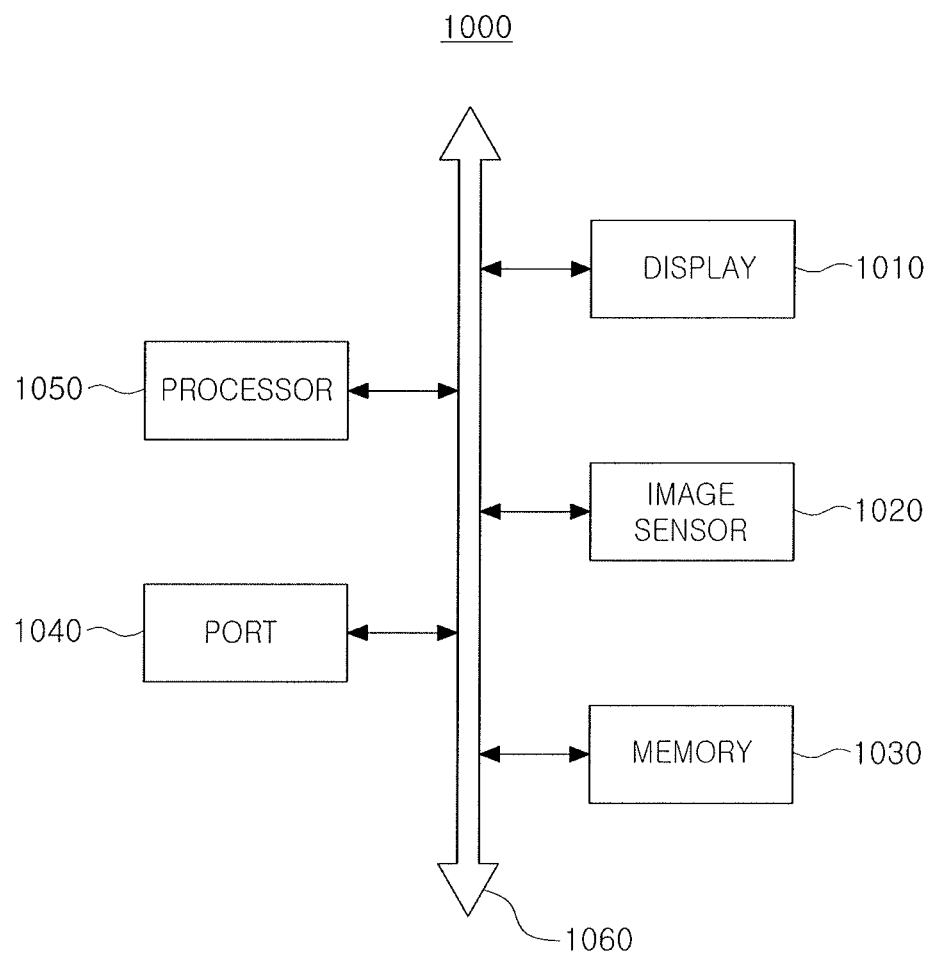
FIG. 19 illustrates an electronic device including a memory device according to an example embodiment.

FIG. 19 illustrates an electronic device including a memory device according to an example embodiment. A computer device 1000 according to an example embodiment illustrated in FIG. 19 may include a display 1010, an image sensor 1020, a memory 1030, a port 1040, a processor 1050, and the like. The computer device 1000 may further include a wire/wireless communications device, a power supply, and the like.

Among components illustrated in FIG. 19, the port 1040 may be provided for the computer device 1000 to communicate with a video card, a sound card, a memory card, a universal serial bus (USB) device, and the like. The computer device 1000 may be a concept including a smartphone, a tablet PC, a smart wearable device, and the like, as well as a desktop computer and a laptop computer according to the related art.

The processor 1050 may perform a certain operation, a command, a task, and the like. The processor 1050 may be a central processing unit (CPU), a microprocessor unit (MCU), a System on Chip (SoC), or the like, and may communicate with the display 1010, the image sensor 1020, the memory 1030, and other devices connected to the port 1040 through a bus 1060.

The memory 1030 may be a storage medium storing data necessary for an operation of the computer device 1000, or multimedia data. The memory 1030 may include a volatile memory such as a random access memory (RAM) or a non-volatile memory such as a flash memory. In addition, the memory 1030 may include at least one of a solid state drive (SSD), a hard disk drive (HDD), and an optical disk drive (ODD), as a storage device. In an example embodiment, the memory 1030 may include a memory device according to various example embodiments previously described with reference to FIGS. 1 to 18.

As set forth above, a memory device including fuse cells of various types are available for a repair process for replacing a defective memory cell of a memory device with a redundancy memory cell, and a test procedure, and/or a customizing procedure. According to example embodiments, first fuse cells having a structure the same as that of memory cells, and second fuse cells having a structure different from that of memory cells are included in a memory cell array, and a memory controller may write data to the first fuse cells and the second fuse cells as needed. According to example embodiments, data stored in fuse cells is prevented from being deleted in a test procedure and/or a process for manufacturing, so an operation performance and reliability of a memory device may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory device, comprising:
a memory cell array including a plurality of memory cells, the memory cell array having a first fuse region and a second fuse region, the first fuse region including a plurality of first fuse cells having a structure the same as a structure of the plurality of memory cells, and the second fuse region including a plurality of second fuse cells having a structure different from a structure of the plurality of memory cells; and
a memory controller to control the plurality of memory cells and write fuse data stored in the first fuse region to the second fuse region after an electrical die sort (EDS) test that tests electrical characteristics is completed, the memory controller having a fuse selection circuit to select one of the first fuse region and the second fuse region,
wherein each of the plurality of memory cells and the plurality of first fuse cells includes a data storage element and a switch element connected in series, and
the plurality of memory cells stores data using changes in resistance of the data storage element.

2. The memory device as claimed in claim 1, wherein the first fuse region is in a center of the memory cell array.

3. The memory device as claimed in claim 1, wherein the first fuse region and the second fuse region are adjacent to each other in the memory cell array.

4. The memory device as claimed in claim 1, wherein the first fuse region and the second fuse region are separated from each other in the memory cell array.

5. The memory device as claimed in claim 1, wherein the plurality of second fuse cells are antifuse cells.

6. The memory device as claimed in claim 1, wherein the memory controller writes fuse data, stored in the first fuse region, to the second fuse region after the EDS test is completed and before a packaging process is performed.

7. The memory device as claimed in claim 1, wherein the memory controller writes fuse data for a package test to the first fuse region after the EDS test and a packaging process are completed.

8. The memory device as claimed in claim 7, wherein the memory controller writes data stored in the first fuse region to the second fuse region after the package test is completed.

9. The memory device as claimed in claim 1, wherein a number of the plurality of second fuse cells is greater than or equal to a number of the plurality of first fuse cells.

10. A memory device, comprising:
- a memory cell array including a plurality of memory cells that store data using changes in resistance, a plurality of electrical fuse cells having a structure the same as a structure of the plurality of memory cells, and a plurality of antifuse cells; and
- a fuse selection circuit to select one among the plurality of electrical fuse cells and the plurality of antifuse cells,
- wherein the plurality of electrical fuse cells are used as redundancy memory cells for the plurality of memory cells.

11. The memory device as claimed in claim 10, further comprising:
- a page buffer circuit to store data to the memory cell array, and read data stored in the memory cell array,
- wherein the page buffer circuit reads data stored in the plurality of electrical fuse cells and writes the data to the plurality of antifuse cells, when a predetermined test procedure is terminated.

12. The memory device as claimed in claim 11, wherein the fuse selection circuit selects the plurality of electrical fuse cells before the predetermined test procedure is terminated and selects the plurality of antifuse cells when the predetermined test procedure is terminated.

13. The memory device as claimed in claim 11, wherein the predetermined test procedure includes at least one of an electrical die sort (EDS) test procedure and a package test procedure.

14. A memory device, comprising:
- a plurality of memory cells to store data using changes in resistance;
- a plurality of first fuse cells having a structure the same as a structure of the plurality of memory cells;
- a plurality of second fuse cells having a structure different from a structure of the plurality of memory cells; and
- a memory controller to write fuse data stored in the plurality of first fuse cells to the plurality of second fuse cells, and to use the plurality of first fuse cells as redundancy memory cells for the plurality of memory cells.

15. The memory device as claimed in claim 14, wherein the plurality of first fuse cells are electrical fuse cells, and the plurality of second fuse cells are antifuse cells.

* * * * *